(12) United States Patent
Crouch et al.

(10) Patent No.: US 9,000,403 B2
(45) Date of Patent: Apr. 7, 2015

(54) SYSTEM AND METHOD FOR ADJUSTING SEED LASER PULSE WIDTH TO CONTROL EUV OUTPUT ENERGY

(71) Applicant: Cymer, Inc., San Diego, CA (US)

(72) Inventors: James Crouch, San Diego, CA (US); Matthew Graham, San Diego, CA (US); Robert J. Rafac, Encinitas, CA (US); Daniel Jason Riggs, San Diego, CA (US)

(73) Assignee: ASML Netherlands B.V., Veldhoven (NL)

( * ) Notice: Subject to any disclaimer, the term of this patent is extended or adjusted under 35 U.S.C. 154(b) by 153 days.

(21) Appl. No.: 13/768,588

(22) Filed: Feb. 15, 2013

(65) Prior Publication Data

US 2014/0233005 A1    Aug. 21, 2014

(51) Int. Cl.
*H05G 2/00*    (2006.01)
*G03F 7/20*    (2006.01)

(52) U.S. Cl.
CPC ............ *H05G 2/008* (2013.01); *G03F 7/70033* (2013.01); *H05G 2/003* (2013.01)

(58) Field of Classification Search
CPC ............ G03F 7/70025; G03F 7/70041; G03F 7/70575; G03F 7/70933; G03F 7/70033; H01S 3/11; H05G 2/003; H05G 2/008

USPC ...................... 355/67, 77; 378/134; 388/804; 250/492.1, 504 R
See application file for complete search history.

(56) References Cited

U.S. PATENT DOCUMENTS

| | | | |
|---|---|---|---|
| 8,324,601 B2 | 12/2012 | Hoshino et al. | |
| 2005/0129177 A1* | 6/2005 | Berglund et al. | ............. 378/119 |
| 2009/0010288 A1* | 1/2009 | Keaton et al. | ................... 372/25 |
| 2012/0193547 A1 | 8/2012 | Hansson et al. | |

FOREIGN PATENT DOCUMENTS

| | | |
|---|---|---|
| WO | WO 2012114172 A1 * | 8/2012 |
| WO | 2012131452 A1 | 10/2012 |
| WO | WO 2012131455 A1 * | 10/2012 |

* cited by examiner

*Primary Examiner* — Steven H Whitesell Gordon
(74) *Attorney, Agent, or Firm* — Gard & Kaslow LLP

(57) ABSTRACT

A method and apparatus for controlling the seed laser in a laser produced plasma (LPP) extreme ultraviolet (EUV) light system are disclosed. In one embodiment, a seed laser generates both pre-pulses and main pulses which are amplified and irradiate a target material. The widths of the main pulses are adjusted, for example by the use of an EOM or other optical switch, without adjusting the widths of the pre-pulses, to keep the EUV output energy at a desired level. Only if the main pulse widths are longer or shorter than a desired range is the duty cycle of the laser amplifier adjusted, to keep the main pulse widths in the desired range. Adjusting the main pulse widths in this way before adjusting the pump RF duty cycle allows for less adjustment of the duty cycle, thus causing less adjustment to the pre-pulses.

18 Claims, 9 Drawing Sheets

SYSTEM AND METHOD FOR ADJUSTING SEED LASER PULSE WIDTH TO CONTROL EUV OUTPUT ENERGY

FIELD OF THE INVENTION

The present invention relates generally to laser produced plasma extreme ultraviolet light sources. More specifically, the invention relates to a system and method for the use of seed lasers as such light sources.

BACKGROUND OF THE INVENTION

The semiconductor industry continues to develop lithographic technologies which are able to print ever-smaller integrated circuit dimensions. Extreme ultraviolet ("EUV") light (also sometimes referred to as soft x-rays) is generally defined to be electromagnetic radiation having wavelengths of between 10 and 120 nanometers (nm). EUV lithography is currently generally considered to include EUV light at wavelengths in the range of 10-14 nm, and is used to produce extremely small features, for example, sub-32 nm features, in substrates such as silicon wafers. To be commercially useful, it is desirable that these systems be highly reliable and provide cost effective throughput and reasonable process latitude.

Methods to produce EUV light include, but are not necessarily limited to, converting a material into a plasma state that has one or more elements, e.g., xenon, lithium, tin, indium, antimony, tellurium, aluminum, etc., with one or more emission line(s) in the EUV range. In one such method, often termed laser produced plasma ("LPP"), the required plasma can be produced by irradiating a target material, such as a droplet, stream or cluster of material having the desired line-emitting element, with a laser beam at an irradiation site. The line-emitting element may be in pure form or alloy form, for example, an alloy that is a liquid at desired temperatures, or may be mixed or dispersed with another material such as a liquid.

In some prior art LPP systems, droplets in a droplet stream are irradiated by a separate laser pulse to form a plasma from each droplet. Alternatively, some prior art systems have been disclosed in which each droplet is sequentially illuminated by more than one light pulse. In some cases, each droplet may be exposed to a so-called "pre-pulse" to heat, expand, gasify, vaporize, and/or ionize the target material and/or generate a weak plasma, followed by a so-called "main pulse" to generate a strong plasma and convert most or all of the pre-pulse affected material into plasma and thereby produce an EUV light emission. It will be appreciated that more than one pre-pulse may be used and more than one main pulse may be used, and that the functions of the pre-pulse and main pulse may overlap to some extent.

Since EUV output power in an LPP system generally scales with the drive laser power that irradiates the target material, in some cases it may also be considered desirable to employ an arrangement including a relatively low-power oscillator, or "seed laser," and one or more amplifiers to amplify the pulses from the seed laser. The use of a large amplifier allows for the use of a low power, stable seed laser while still providing the relatively high power pulses used in the LPP process.

Systems currently known and used in the art typically set a fixed pulse width for the main pulse that is expected to produce the greatest amount of EUV energy under ideal conditions. The drive laser RF pump power that is applied to the amplifier is then adjusted through an RF generator, which uses pulse width modulation (PWM) to adjust the duty cycle (the fraction of the operating time that RF power is generated) to obtain the maximum or desired amount of EUV energy.

This approach has several limitations. First, it is relatively slow in comparison to the operation of the system. The laser power can only be changed in small amounts from one pulse to the next, and thus when the duty cycle is changed the system typically takes a number of pulses to change output.

In addition, the main pulse and pre-pulse typically go through the same amplifiers, since providing a separate set of amplifiers for each pulse is generally considered to be prohibitively expensive. If both pulses are amplified by the same amplifier, any change in the gain achieved by changing the duty cycle affects both pulses. However, it is common for the pre-pulse to be optimized to produce desired effects on both the expansion and trajectory of the target droplets; thus, a change in the duty cycle which also changes the energy in the pre-pulse might have detrimental effects on the performance of the system. It would thus be preferable for targeting stability to maintain a constant pre-pulse energy and adjust only the main pulse if possible.

Accordingly, it would be desirable to be able to adjust the EUV output energy in such an EUV light source faster than by adjusting the duty cycle and by adjusting the duty cycle as little as possible, and also to be able to adjust the energy of the main pulses without also adjusting the energy of the pre-pulses.

SUMMARY OF THE INVENTION

Disclosed herein are a system and method for adjusting the pulse widths of the main pulses of a seed laser to control the output energy of an EUV system.

One embodiment describes a method of controlling the output of an EUV LLP system having seed lasers which produce pre-pulses and main pulses, comprising: operating the seed lasers to generate a pre-pulse and a main pulse at a pre-pulse width and a main pulse width respectively; amplifying the main pulse with an amplifier having a duty cycle controlled RF pump rate and irradiating a target material with the amplified pulses to generate an EUV output having energy; adjusting the main pulse width by shortening the main pulse width if the generated EUV output energy is above a desired EUV output energy and lengthening the main pulse width if the EUV energy is below the desired EUV output energy; adjusting the duty cycle by increasing the duty cycle if the main pulse width is longer than a desired range and decreasing the duty cycle if the main pulse width is shorter than the desired range.

Another embodiment describes a system for controlling the output energy of an EUV LLP system having seed lasers which produce a pre-pulse and a main pulse at a pre-pulse width and a main pulse width respectively, comprising: optical switches capable of passing the pre-pulse and main pulse and opening and closing at a desired time to determine the width of each pulse that is passed through the switch; an amplifier having a duty cycle for amplifying the main pulse; a target chamber for irradiating a target material with the amplified pulses such that EUV output energy is produced; a sensor for measuring the EUV output energy and generating a sensor signal indicating the level of the EUV output energy compared to a desired EUV output energy; a pulse width controller for: receiving the sensor signal and generating a first pulse width signal instructing the optical switch to shorten the width of the next main pulse if the EUV output energy is above the desired energy and lengthen the width of the next main pulse if the EUV energy is below the desired output energy, and generating a second pulse width signal indicating the length of the main pulse width compared to an acceptable range; and a duty cycle controller for receiving the second pulse width signal and increasing the duty cycle if the main pulse width is longer than the acceptable range and decreasing the duty cycle if the main pulse width is shorter than the acceptable range.

Still another embodiment describes a non-transitory computer-readable medium having embodied thereon a program, the program being executable by a processor to perform a method of controlling the output of an EUV LLP system having a seed laser which produces pre-pulses and main pulses, the method comprising the steps of: operating the seed lasers to generate a pre-pulse and a main pulse at a pre-pulse width and a main pulse width respectively; amplifying the main pulse with an amplifier having a duty cycle controlled RF pump rate and irradiating a target material with the amplified pulses to generate an EUV output having energy; adjusting the main pulse width by shortening the main pulse width if the generated EUV output energy is above a desired EUV output energy and lengthening the main pulse width if the EUV energy is below the desired EUV output energy; adjusting the duty cycle by increasing the duty cycle if the main pulse width is longer than a desired range and decreasing the duty cycle if the main pulse width is shorter than the desired range.

DETAILED DESCRIPTION OF THE INVENTION

The present application describes a system and method for adjusting the pulse widths of the main pulses of a seed laser to control the output energy of an EUV LPP system.

In one embodiment, an acceptable range of pulse widths for the main pulses is identified, and the seed laser begins to generate main pulses at a target width within that range. The pulse widths of subsequent main pulses are then adjusted to keep the EUV output energy in a desired range. When the pulse widths of the main pulses are considered to be too far from the target width or are outside of the acceptable range, the laser amplifier RF power duty cycle is adjusted so that the pulse widths of the main pulses may be returned to the acceptable range.

Figure 1:
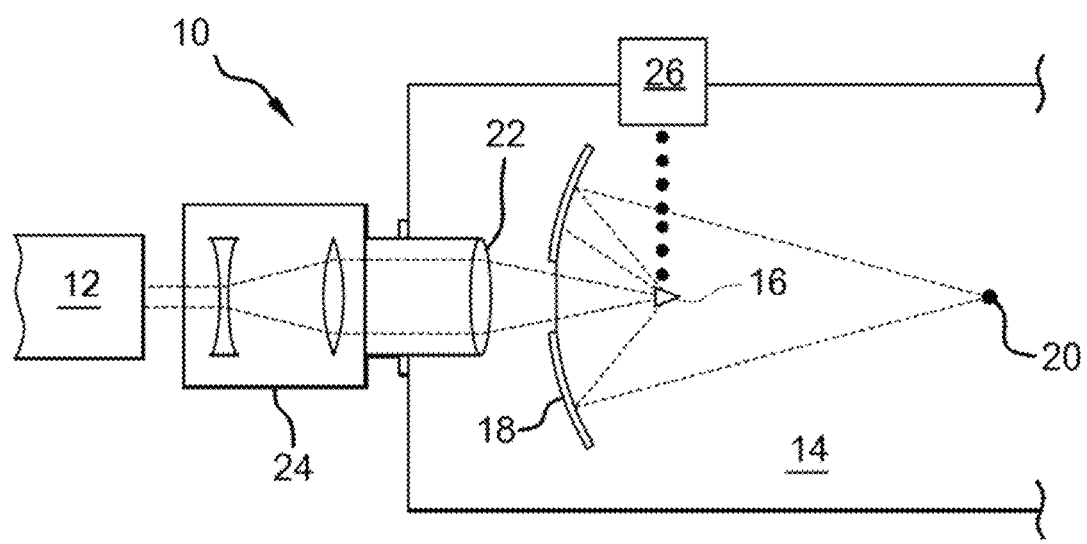
FIG. 1 is an illustration of some of the components of an embodiment of an LPP EUV system as known in the prior art.

FIG. 1 is a simplified schematic view of some of the components of one embodiment of an LPP EUV light source 10. As shown in FIG. 1, the EUV light source 10 includes a laser source 12 for generating a beam of laser pulses and delivering the beam along one or more beam paths from the laser source 12 and into a chamber 14 to illuminate a respective target, such as a droplet, at an irradiation region 16.

As also shown in FIG. 1, the EUV light source 10 may also include a target material delivery system 26 that, for example, delivers droplets of a target material into the interior of chamber 14 to the irradiation region 16, where the droplets will interact with one or more laser pulses to ultimately produce plasma and generate an EUV emission. Various target material delivery systems have been presented in the prior art, and their relative advantages will be apparent to those of skill in the art.

As above, the target material is an EUV emitting element that may include, but is not necessarily limited to, a material that includes tin, lithium, xenon or combinations thereof. The target material may be in the form of liquid droplets, or alternatively may be solid particles contained within liquid droplets. For example, the element tin may be presented as a target material as pure tin, as a tin compound, such as $SnBr_4$, $SnBr_2$, $SnH_4$, as a tin alloy, e.g., tin-gallium alloys, tin-indium alloys, or tin-indium-gallium alloys, or a combination thereof. Depending on the material used, the target material may be presented to the irradiation region 16 at various temperatures including room temperature or near room temperature (e.g., tin alloys or $SnBr_4$), at a temperature above room temperature (e.g., pure tin), or at temperatures below room temperature (e.g., $SnH_4$). In some cases, these compounds may be relatively volatile, such as $SnBr_4$. Similar alloys and compounds of EUV emitting elements other than tin, and the relative advantages of such materials and those described above will be apparent to those of skill in the art.

Returning to FIG. 1, the EUV light source 10 may also include an optical element 18 such as a near-normal incidence collector mirror having a reflective surface in the form of a prolate spheroid (i.e., an ellipse rotated about its major axis), such that the optical element 18 has a first focus within or near the irradiation region 16 and a second focus at a so-called intermediate region 20, where the EUV light may be output from the EUV light source 10 and input to a device utilizing EUV light such as an integrated circuit lithography tool (not shown). As shown in FIG. 1, the optical element 18 is formed with an aperture to allow the laser light pulses generated by the laser source 12 to pass through and reach the irradiation region 16.

The optical element 18 should have an appropriate surface for collecting the EUV light and directing it to the intermediate region 20 for subsequent delivery to the device utilizing the EUV light. For example, optical element 18 might have a graded multi-layer coating with alternating layers of molybdenum and silicon, and in some cases, one or more high temperature diffusion barrier layers, smoothing layers, capping layers and/or etch stop layers.

It will be appreciated by those of skill in the art that optical elements other than a prolate spheroid mirror may be used as optical element 18. For example, optical element 18 may alternatively be a parabola rotated about its major axis or may be configured to deliver a beam having a ring-shaped cross section to an intermediate location. In other embodiments, optical element 18 may utilize coatings and layers other than or in addition to those described herein. Those of skill in the art will be able to select an appropriate shape and composition for optical element 18 in a particular situation.

As shown in FIG. 1, the EUV light source 10 may include a focusing unit 22 which includes one or more optical elements for focusing the laser beam to a focal spot at the irradiation site. EUV light source 10 may also include a beam conditioning unit 24, having one or more optical elements, between the laser source 12 and the focusing unit 22, for expanding, steering and/or shaping the laser beam, and/or shaping the laser pulses. Various focusing units and beam conditioning units are known in the art, and may be appropriately selected by those of skill in the art.

As noted above, in some cases laser source 12 comprises seed lasers and one or more amplifiers. The seed laser generates laser pulses, which are then amplified to become the laser beam that irradiates the target material at irradiation site 16 to form a plasma that produces the EUV emission.

One of skill in the art will appreciate that a number of types of seed lasers may be used to generate the pre-pulse and the main pulse. For example, a conventional dual-chamber transverse-flow laser source in what has traditionally been known as a "master oscillator-power amplifier" ("MOPA") configuration may be used. Alternatively, a newer type of laser known as a fast axial flow laser may be used. A single laser source may produce both the pre-pulse and the main pulse. Alternatively, separate seed lasers may be used to produce the pre-pulse and the main pulse, in what is commonly known as a MOPA+PP laser.

One type of seed laser commonly used in some embodiments of EUV systems is a $CO_2$ laser, while other embodiments may use a YAG (yttrium-aluminum-garnet) laser. Where there are two seed lasers, they may be of different types; however, for example, a YAG laser will need a separate amplifier or amplifier chain than a $CO_2$ laser. One of skill in the art will recognize that there are other types of lasers than $CO_2$ and YAG lasers, and other configurations than MOPA and MOPA+PP lasers, and will be able to determine which types and configurations of lasers will be suitable for the desired application.

Figure 2:
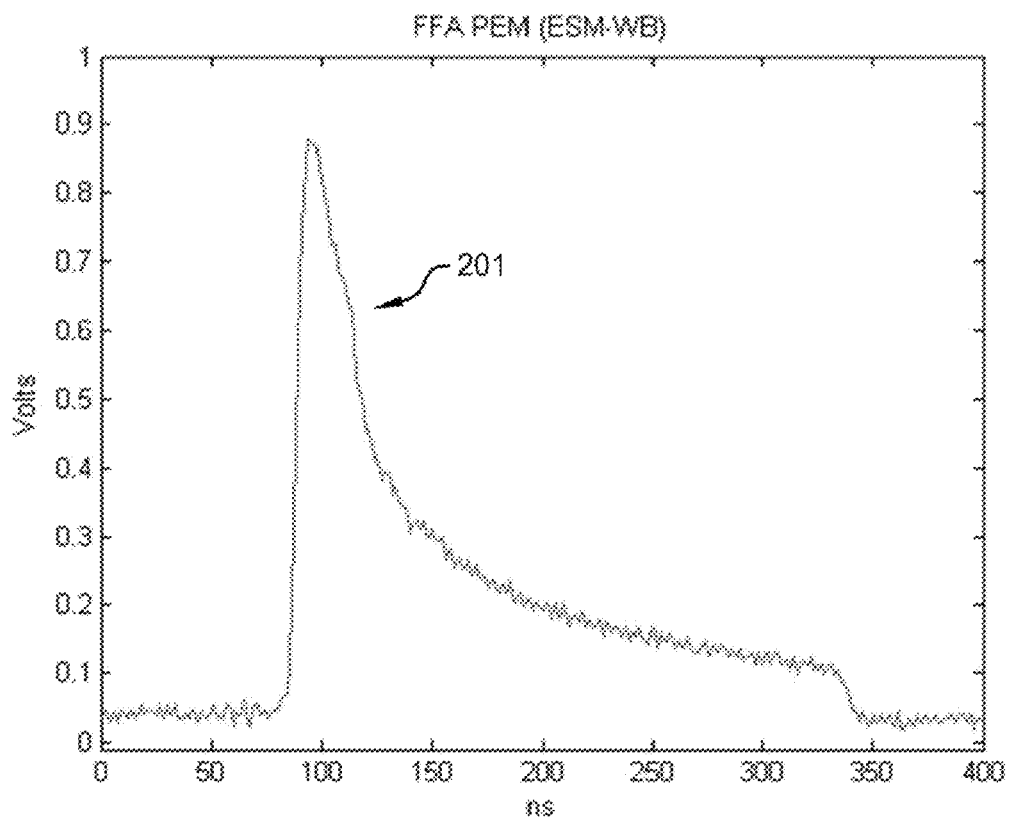
FIG. 2 is a graph of a sample main laser pulse from a $CO_2$ seed laser.

FIG. 2 is a graph of a typical main laser pulse from a $CO_2$ drive laser after it passes through an amplifier, with curve 201 showing the intensity of the pulse over time. It may be seen that the intensity falls off steeply after the initial peak; this is typical of the passing of a pulse through an amplifier, as the leading edge of the pulse saturates the amplifier and uses most of the gain as it passes. The pulse width as illustrated is approximately 250 nanoseconds (ns) from the leading edge (at about 80 ns on the x-axis) to the trailing edge (at about 330 ns on the x-axis). This is typical of a main pulse in a traditional MOPA configuration, which has generally been in the range of 100 to 300 ns, and longer than a typical main pulse in a MOPA+PP configuration, in which main pulses close to 100 ns are now used. Pre-pulses have generally been in the range of 50 to 150 ns, and may now be 30 to 70 ns. Both main pulses and pre-pulses are expected to continue to shorten, possibly even into ranges measured in picoseconds.

As above, in the prior art, a pulse width that is shorter than the Q-switched pulse from the seed laser is generally selected in advance. This may be accomplished, for example, by passing the pulse through an optical switch, such as an electro-optic modulator (EOM), which may be located in the beam conditioning unit 24 of FIG. 1 and which acts as a shutter to shorten the pulse, opening to allow the leading edge of the pulse to pass and then closing to cut the tail end of the pulse off at the desired point.

Figure 3:
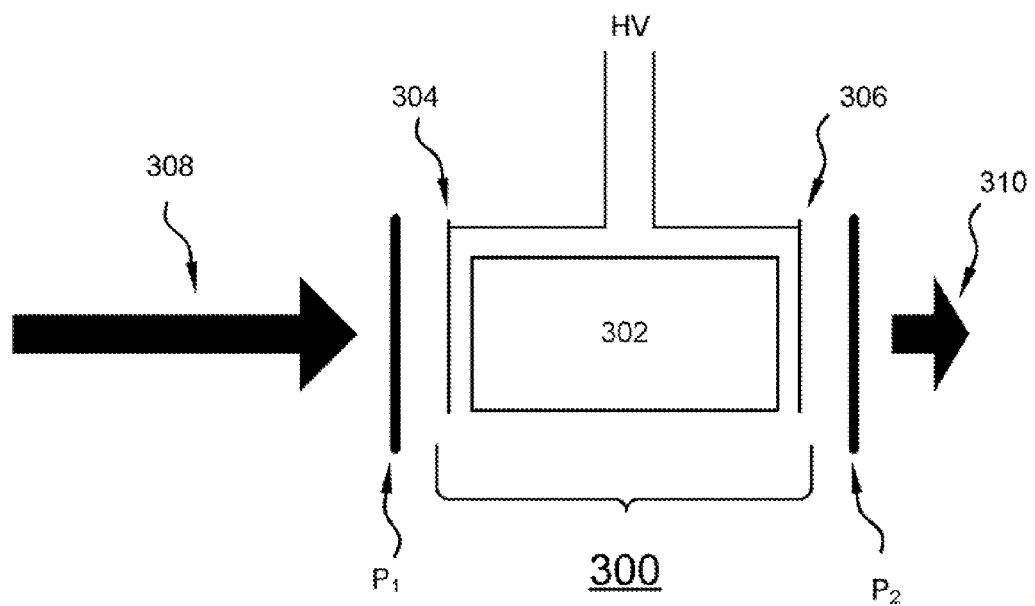
FIG. 3 is a diagram of one type of an electro-optic modulator (EOM) that may be used in connection with a seed laser in one embodiment.

FIG. 3 is a diagram of one type of such an EOM 300 consisting of a crystal 302 which is sandwiched between two electrodes 304 and 306. One material that may be used for such a crystal is cadmium telluride (CdTe); there are other materials used in EOMs as well.

When a high voltage HV (about 5,000 volts, or 5 kilovolts or kV) is applied to the electrodes 304 and 306, an electric field is produced that is parallel to the optic axis of the crystal 302 which causes the polarization of light passing through the crystal to rotate by 90 degrees.

Polarizers P1 and P2 are placed on either side of the EOM 300; polarizers P1 and P2 are "crossed," i.e., the orientation of the light that will pass through the polarizers is rotated 90 degrees with respect to each other. Thus, in the absence of EOM 300, a laser pulse 308, oriented to pass through polarizer P1, would not pass through polarizer P2 due to the 90 degree change in orientation of polarizer P2 with respect to that of polarizer P1.

When no voltage is applied to EOM 300, the orientation of pulse 308, which has passed through polarizer P1, is not altered by its passage through crystal 302 and thus does not pass through polarizer P2. However, when the voltage HV is applied to EOM 300, the orientation of pulse 308 is rotated 90 degrees as it passes through crystal 302, and this passes through polarizer P2.

When voltage is applied, an EOM using a CdTe crystal is capable of switching from "off" (no change in orientation of passing light, so that pulse 308 is prevented from passing by polarizers P1 and P2) to "on" (a change in the orientation of pulse 308 occurs after it passes through polarizer P1 so that it may also pass through polarizer P2 and becomes pulse 310), or from "on" to "off," in about 3.5 ns. Thus, such an EOM may be used to shorten a passing laser pulse by applying voltage and turning the EOM "on" before the leading edge of the pulse arrives and then turning the EOM "off" by removing the applied voltage at the appropriate time.

This is, in fact, a common way in which prior art systems shorten a laser pulse such as pulse 308 from its full width, such as is shown in FIG. 3, to a pulse of a pre-determined length, such as pulse 310, as stated above. However, in addition, such an EOM operates fast enough to change the width of each individual pulse if desired.

It will also be noted that where a single seed laser produces both pre-pulses and main pulses, the pre-pulses may also pass through the EOM, and through the same amplifiers. Since the interval between a main pulse and the next pre-pulse is typically on the order of 15-20 microseconds ($\mu$s), given the typical switching time of the EOM as above there is ample time to turn the EOM on or off as necessary, and thus only adjust the widths of the main pulses without affecting the pre-pulses.

In embodiments with separate seed lasers for pre-pulses and main pulses, there may preferably be two EOMs, one for each seed laser, and the resulting beams combined between the EOMs and the amplifiers. Such embodiments may simpler in some respects, since the wavelengths of the seed lasers may be different, and the interval between a pre-pulse and the corresponding pre-pulse is typically significantly shorter than the time between a main pulse and the next pre-pulse. Alternatively, in some embodiments the pre-pulses may not be passed through an EOM or an amplifier, or may be passed through a different amplifier than that used for the main pulses.

Figure 4:
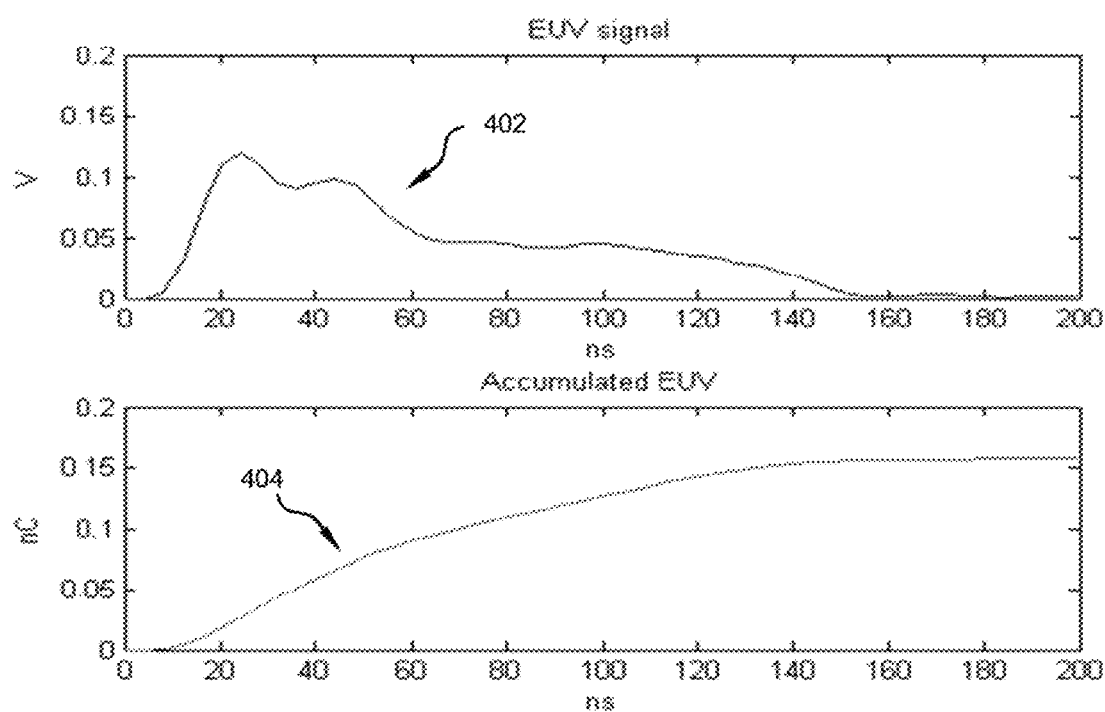
FIG. 4 is a graph of the EUV output resulting from a main laser pulse such as is shown in FIG. 2.

FIG. 4 is a graph of the EUV output that might be obtained from a pulse from an MOPA+PP seed laser with a pulse width which has been limited to about 120 ns, a pulse width sometimes selected in the prior art. Curve 402 shows the EUV signal produced at each point in time, while curve 404 shows the accumulated EUV energy since the beginning of the pulse.

It may be seen in FIG. 4 that the rate of production of EUV energy is not uniform throughout the laser pulse, and decreases near the end of the pulse. Thus, curve 402 indicates that more EUV energy is produced early in the pulse, with a subsequent drop off. It is believed that this is due to the plasma dispersing, indicating that most of the target material has been vaporized. Curve 404 similarly shows that the accumulated energy increases more rapidly early in the pulse and then levels off toward the end of the pulse.

It may be seen that curve 404 shows a roughly linear increase for the period from about 50 ns to 110 ns, indicating an approximately constant EUV production rate during this period. For this reason, shortening the pulse further from 120 ns to as little as 50 ns will result in a decrease in the accumulated EUV energy generated that is roughly linear with the decrease in pulse width. This allows control of the EUV accumulated energy, or "yield," within a range by controlling the width of the pulse from the seed laser. As above, control of the pulse width may be made quickly, from pulse to pulse, rather than requiring a plurality of pulses to take effect, as with the duty cycle control of the prior art.

However, as will be apparent to those of skill in the art, the EUV yield also depends upon the power imparted to the target material by the amplified seed laser pulse, which in turn depends upon the RF duty cycle of the laser amplifier. It is possible that even the maximum accumulated EUV obtained from a pulse as shown in FIG. 4 will be below the desired amount. Further, it is desirable to keep the pulse width within the range in which the correlation with the EUV output is approximately linear ("linear range") as shown in FIG. 4. It is therefore desirable to combine the faster control of the pulse width with the slower control of the duty cycle of the prior art.

Figure 5:
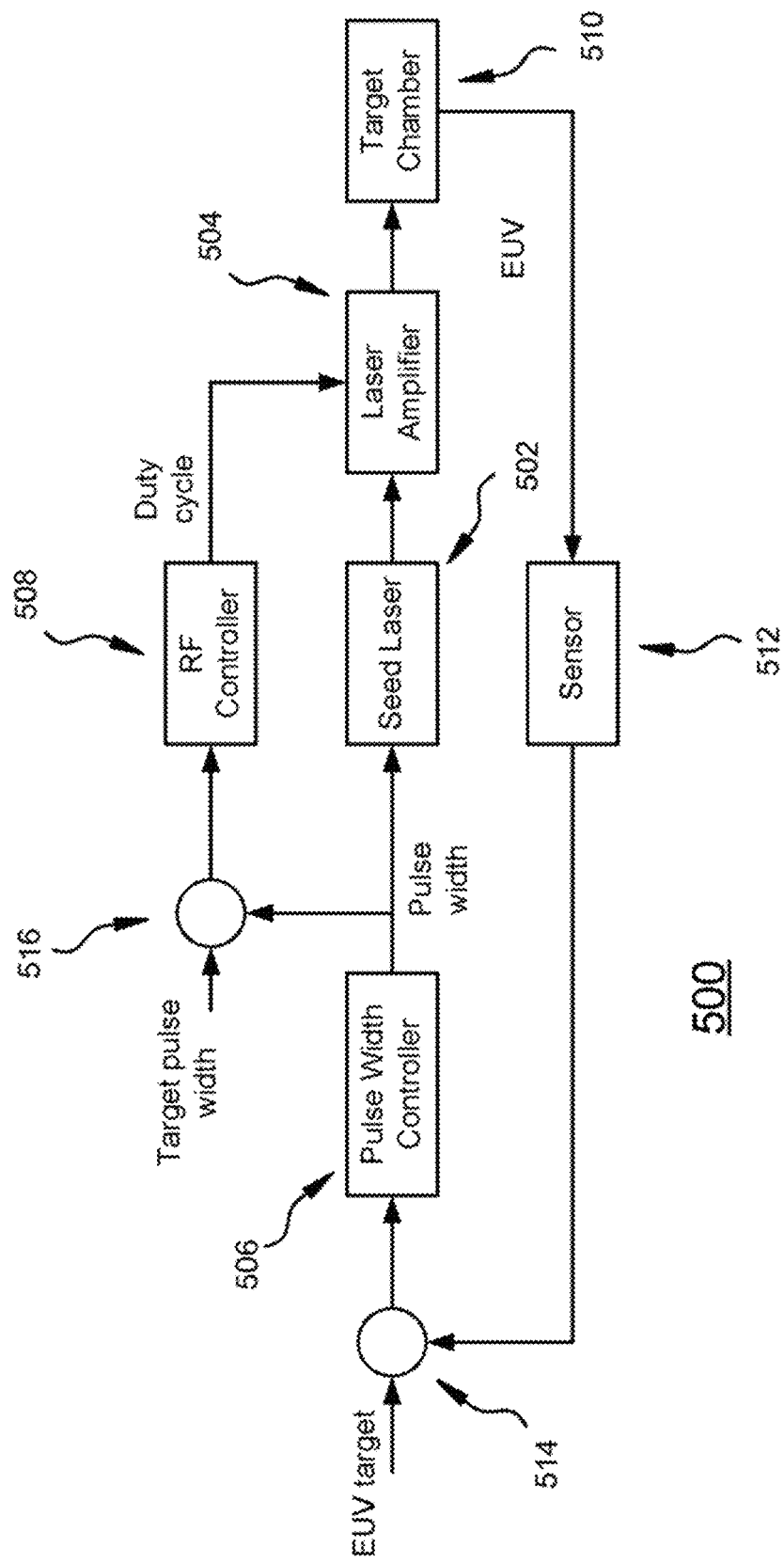
FIG. 5 is a simplified block diagram of a system for adjusting the pulse width of the main pulse of a seed laser and the duty cycle of the seed laser to adjust the output energy of an EUV system in one embodiment.

FIG. 5 is a simplified block diagram of a system 500 using both RF (duty cycle) control and pulse width control to adjust EUV output. A seed laser 502 generates pulses which are amplified by a laser amplifier 504. The generation of the pulses is controlled by a pulse width controller 506, which determines the width of each pulse as above, and an RF controller 508, which determines the duty cycle of the laser amplifier 504 as in the prior art. The pulses are amplified and passed to a target chamber 510 where they irradiate a target material, creating a plasma as above.

The system begins operation with a pre-selected initial duty cycle and target pulse width for the main pulses, as well as an acceptable range of pulse widths; one of skill in art may determine what is considered acceptable, but in general it is believed that the acceptable range is likely to be similar to the linear range such as shown in FIG. 4. The target pulse width will preferably be well within the linear range; the actual pulse widths will vary around the target pulse width as the pulse width controller 506 makes its adjustments on a pulse-to-pulse basis. The initial duty cycle will be estimated to achieve a desired EUV targer output, which output may, for example, be selected by the user.

The pre-pulses may also have a target width, which need not be the same as that of the main pulses. Further, as above, it is desirable to optimize the pre-pulses for their effect on the target material before the main pulses arrive. It is therefore expected that it will be preferable to keep the energy in the pre-pulses constant.

Once the system begins operating, the laser starts with the initial duty cycle and target pulse width; the seed laser pulses are amplified and irradiate the target material in the target chamber 510 as shown in more detail in FIG. 1. The EUV output from target chamber 510 is then measured by a sensor 512 and compared to the EUV target output by a comparator 514, and the result fed back to the pulse width controller 506. If the EUV output is too low, the pulse width controller 506 will increase the width of the next main pulse, within its range (again, the linear portion of curve 404 in FIG. 4), and if the EUV output is too high the pulse width controller 506 will conversely shorten the width of the next main pulse, again within its range, and the process is repeated, thus generating a string of main pulses that have their widths adjusted on a pulse by pulse basis.

However, even if the EUV output is able to reach the desired level in this fashion, with adjustments to the pulse width of the main pulses made on a pulse by pulse basis to keep the EUV output at the desired level, the pulse widths may not be centered around the target pulse width, or may not remain within the acceptable range. Further, it is possible that the EUV output level may remain either too high or too low even when the pulse width has been adjusted to either the shortest or longest value in the acceptable range respectively.

To correct for these problems, the output of the pulse width controller 506 is also fed to a comparator 516, which compares the pulse width determined by the pulse width controller 506 to the target pulse width. The result of this comparison is fed to the RF controller 508. If the pulse widths of the main pulses are within the acceptable range, no adjustment to the duty cycle is necessary, and the RF controller 508 will continue to run the laser amplifier 504 at the initial duty cycle.

However, if the pulse width controller 506 output indicates that the pulse widths are not within the acceptable range, or the EUV output is too high or too low, the RF controller 508 will alter the duty cycle to change the EUV output. The RF controller 508 will increase the duty cycle if the EUV output is too low or the main pulse widths too long, or decrease the duty cycle if the EUV output is too high or the main pulse widths too short.

As above, it typically takes some number of pulses for such changes to the duty cycle to take effect. As the duty cycle and thus the EUV output changes, the pulse width controller 506 continues to receive feedback of the EUV output; as the EUV output moves in response to the change in the duty cycle, the pulse width controller 506 will continue to adjust the width of the main pulses to return the EUV output the acceptable range.

Thus, if the output of the pulse width controller 506 causes the RF controller 508 to increase the duty cycle, as the duty cycle increases the pulse width controller 506 will shorten the main pulse widths until they are again within the acceptable range. Conversely, if the output of the pulse width controller 506 causes the RF controller 508 to decrease the duty cycle, as the duty cycle is decreased the pulse width controller 506 will lengthen the main pulse widths until they are within the acceptable range.

In this fashion, the pulse width controller 506 will adjust the main pulse widths on a fast pulse-to-pulse basis to keep the EUV output at the desired value, as least as far as its range will allow. When the main pulse widths are not within the acceptable range, the output of the pulse width controller 506 will cause the slower RF controller 508 to adjust the duty cycle as needed to allow the pulse width controller 506 to keep the pulse widths within the acceptable range while keeping the EUV output at the desired value.

It should be noted that as stated above adjusting the duty cycle will change the energy of the pre-pulses as well as that of the main pulses if both the pre-pulses and main pulses go through the same amplifier(s). However, by allowing the pulse width controller to change the pulse widths of the main pulses within the acceptable range before changing the duty cycle, changes to the energy of the pre-pulses will be minimized. Further, again changes to the duty cycle will occur more slowly, and thus may allow for other compensation for the alteration of the pre-pulse energy.

Figure 6:
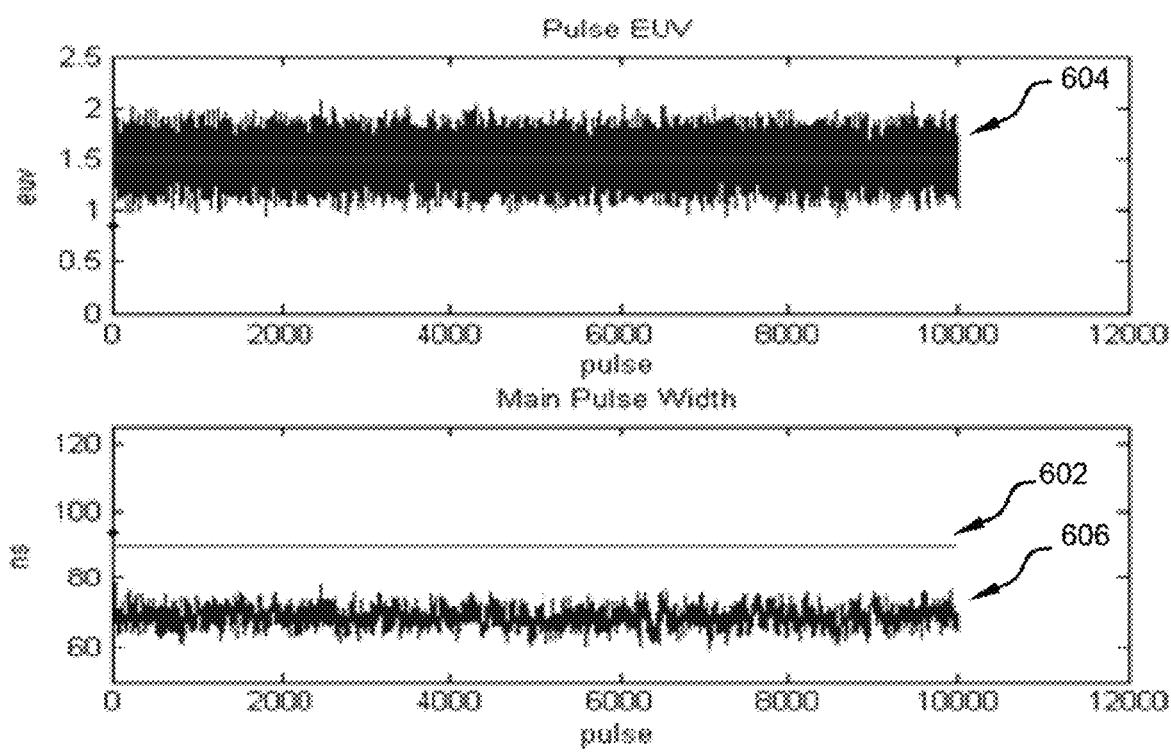
FIG. 6 is a graph of the EUV output of a system at certain operating parameters in one embodiment.

Simulations of such operation have been done and may be illustrated graphically. FIG. 6 shows a graph of the modeled EUV output of a system in one embodiment. Here the desired pulse width has been selected to be approximately in the middle of the linear range, at approximately 90 ns. In this case, the RF controller 508 is set to have the seed laser 502 produce a constant duty cycle of 0.85 as shown by line 602. The desired EUV output ("Pulse EUV") is 1.5.

It may be seen from curve 604 that the system is producing the desired output, i.e., the EUV output is centered around 1.5 and varies less than 0.5 in either direction. However, as shown by curve 606, the pulse width is not centered around 90 ns, but is centered around 65-70 ns and thus may be out of the linear range, or close to being so.

Figure 7:
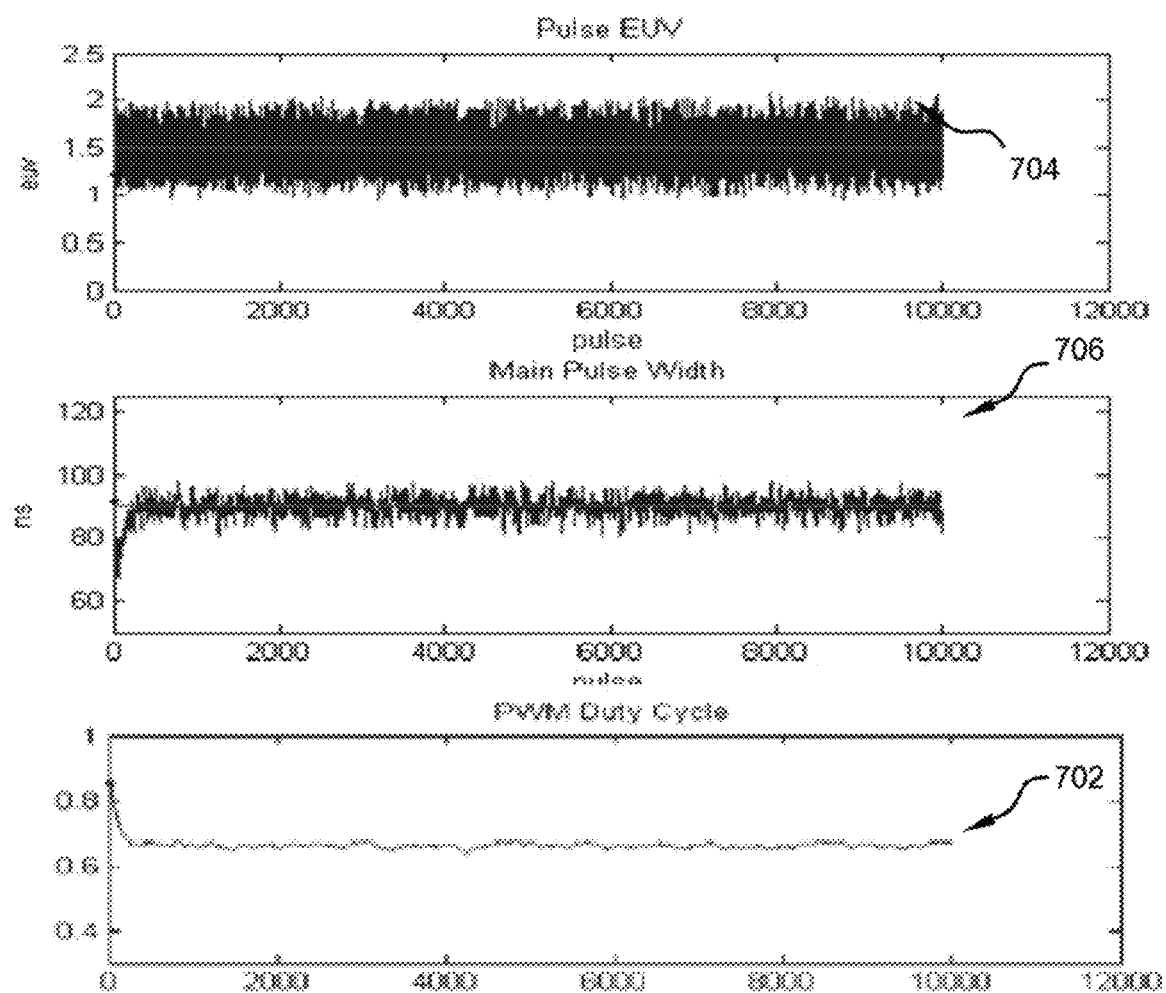
FIG. 7 is a graph of the EUV output of a system illustrating adjustment of the operating parameters according to one embodiment.

FIG. 7 illustrates how this problem may be solved in one embodiment. In this case, an EUV production system starts with the same parameters as stated for FIG. 6 above. However, instead of a constant duty cycle, an RF controller (for example, RF controller 508 on FIG. 5) receives feedback about the pulse width and may change the duty cycle as described above.

Curve 702 shows the duty cycle of the seed laser, which starts (startup occurs at 0 pulses on the x-axis) at the same value of 0.85 as was used in the example of FIG. 6. Curve 704 shows that the system is similarly producing the desired EUV output of 1.5±0.5, and curve 706 shows that the pulse width is initially (also at 0 pulses on the x-axis) again in the range of 65-70 ns, rather than the desired 90 ns.

In the system of FIG. 5, the pulse width controller 506 sends a signal to the RF controller 508 indicating that the pulse widths are centered at a level that is below the desired target value. In response, as seen in curve 702, the RF controller 508 will shorten the duty cycle. This has the effect of decreasing the EUV output of the system, again over some number of pulses as described above.

In response to the decrease in EUV output, the pulse width controller 504 will lengthen the pulse widths, thus increasing the EUV output, and continue to signal the RF controller 506 that the pulse widths remain too short until the pulse widths return to the appropriate value or range. Once the pulse widths are again centered around the target width, the signal sent by the pulse width controller 504 to the RF controller 508 will so indicate, and the RF controller 508 will stop lowering the duty cycle.

Curve 702 thus indicates that in one example, the duty cycle is shortened from the initial value of 0.85 and then settles around approximately 0.65 (fluctuating slightly over time), while curve 706 shows that the average pulse width is increased from approximately 65-70 ns to the desired average value of 90 ns, while keeping the EUV output in the desired range. As can be seen from the x-axis, this may take 100-200 pulses, as again it takes a number of pulses for the change in the duty cycle to be reflected in the EUV output, and thus in the faster-changing pulse widths.

Note that while FIG. 7 shows the duty cycle dropping enough to return the pulse width to an average of 90 ns, this is not necessary, and in fact may be undesirable. Again, the change in the duty cycle will also affect the energy in the pre-pulses. Thus, if the average 65-70 ns pulse widths are still within the acceptable range of pulse widths, no change to the duty cycle need be made, and there will thus be no change at all to the pre-pulse energy while the main pulse energy is controlled by the changes to the pulse width. Alternatively, the average pulse width may be returned to some value that is still less than 90 ns, such as 75 or 80 ns, thus reducing the necessary change in the duty cycle and minimizing the resulting change in pre-pulse energy.

Figure 8:
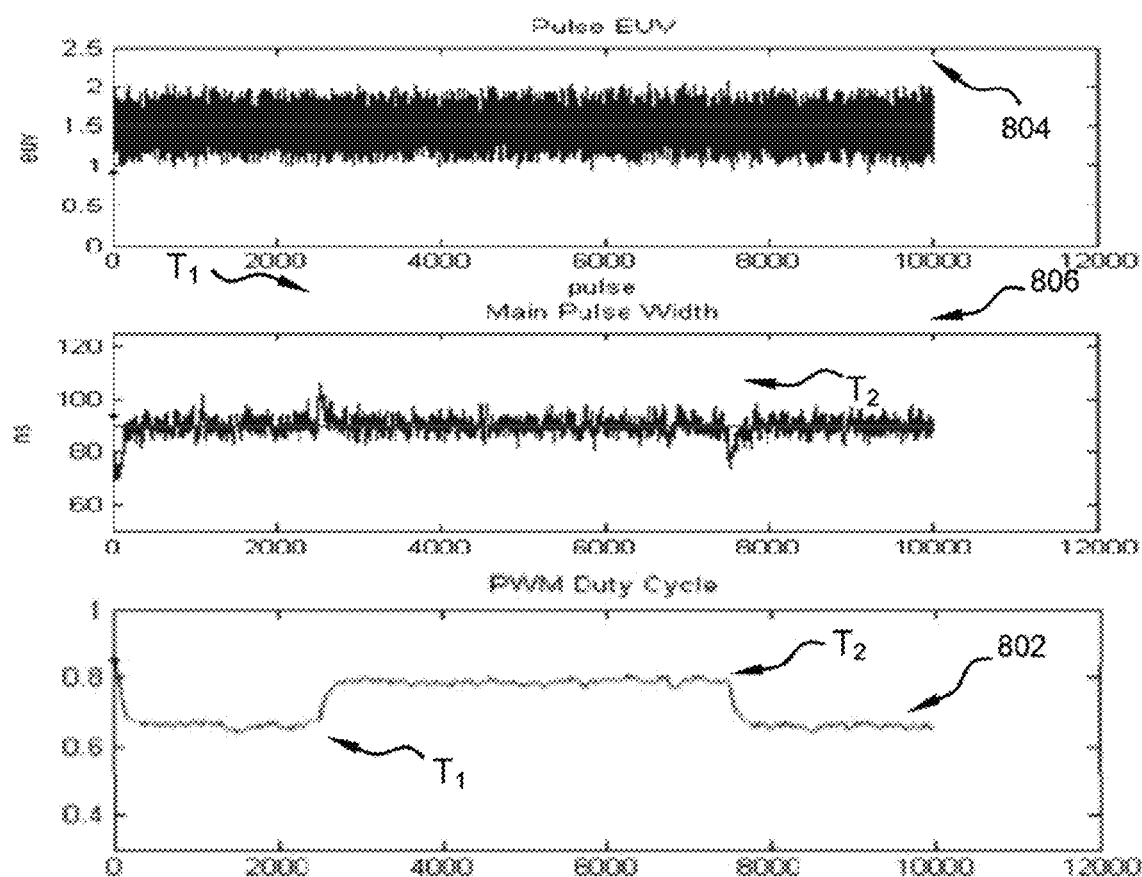
FIG. 8 is a graph of the EUV output of a system illustrating adjustment of the operating parameters according to another embodiment.

FIG. 8 shows the results of another simulation. As seen in curve 802, the duty cycle again starts at 0.85, while the EUV output in curve 804 again shows an output of 1.5±0.5, and the pulse width shown in curve 806 starts at around 70 ns. As in FIG. 7, within about 100 pulses or so the duty cycle has dropped to about 0.65 on curve 802 and the pulse width has increased on curve 806 so that the average appears to be at about the target pulse width of 90 ns.

Next, however, the energy of the seed laser is altered to simulate changes in efficiency. First, at pulse 2500 (T1), the seed laser energy is reduced. A spike in the pulse widths may be seen at T1 in curve 806, as the pulse width controller 504 increases the pulse widths as needed to keep the EUV output in the desired range. This is followed by a shift up in the duty cycle at T1 on curve 802 back to about 0.8, again taking 100 pulses or so, which in turn allows the pulse widths to be dropped back to an average width of 90 ns.

Similarly, at pulse 7500 (T2) the seed laser energy is increased back to its original value. As seen at T2 on curve 806, the average pulse width drops in response, to again keep the EUV output in the desired range, until the RF controller 506 can drop the duty cycle back to the prior value of about 0.65 as seen at T2 on curve 802, in turn allowing the pulse widths to be increased back to the target average of 90 ns.

Again, it may not be necessary or desirable to return the average pulse widths to 90 ns, but only to a value that remains within the acceptable range, again to minimize the required change to the duty cycle and the resulting change in pre-pulse energy.

Figure 9:
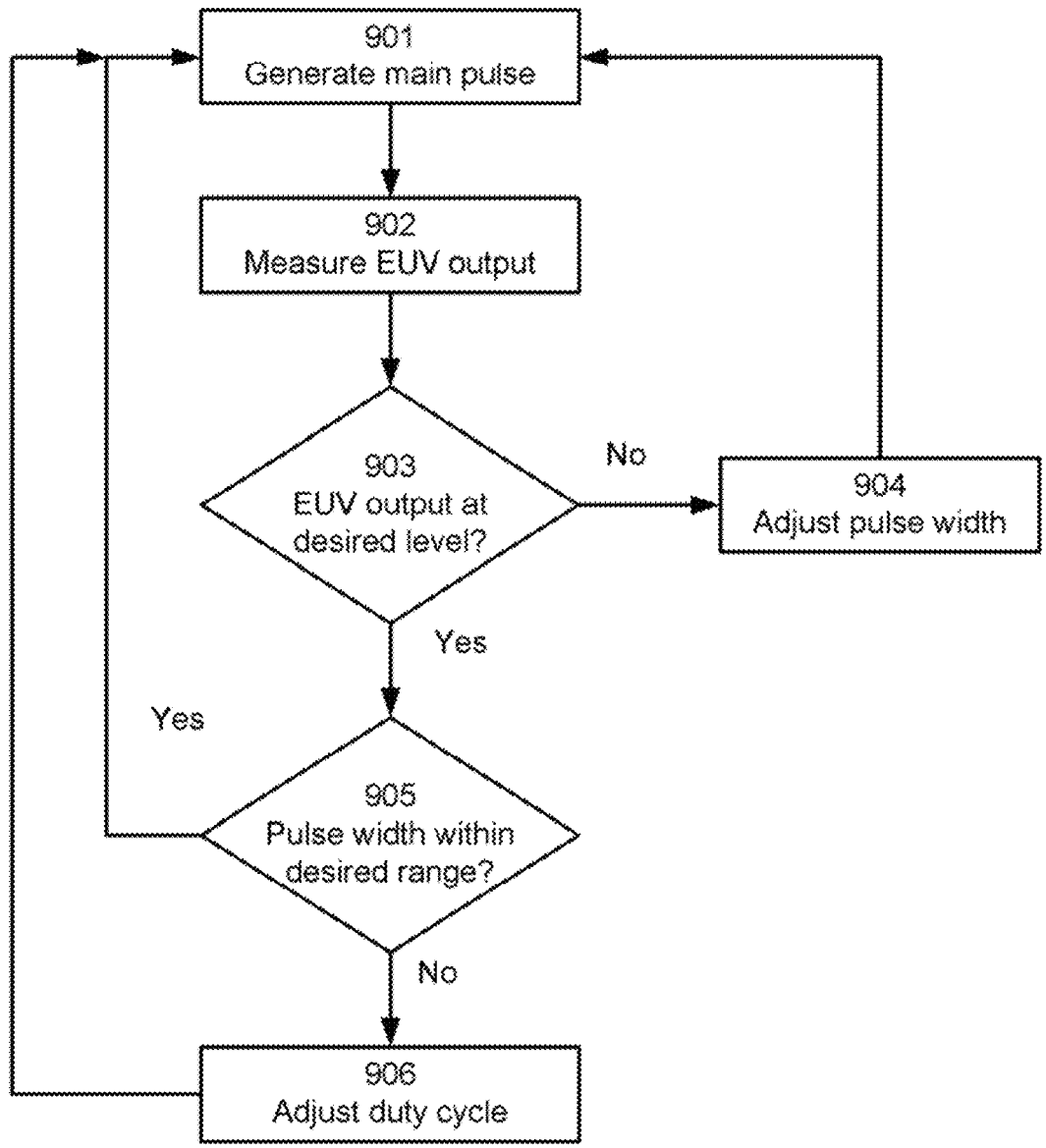
FIG. 9 is a flowchart of a method of adjusting the operating parameters of a seed laser in an EUV system according to one embodiment.

FIG. 9 shows a flow chart of a method of controlling the main pulses from a seed laser in an EUV LLP system according to one embodiment. At step 901, the seed laser, for example seed laser 502 of FIG. 5, generates a main pulse. As above, the first pulse will presumably be at a pre-selected target pulse width that is within the acceptable range of pulse widths (again presumably the linear range), with the seed laser operating at a duty cycle that is estimated to produce a desired EUV output. The seed laser pulse will strike a target material, such as in target chamber 510 of FIG. 5, and create an EUV output.

At step 902, the EUV output is measured by a sensor, such as sensor 512 in FIG. 5, and at step 903 the EUV output is compared to the desired output level, for example by comparator 514 in FIG. 5. If the EUV output is not at the desired level, a signal is sent to the seed laser, for example by the pulse width controller 506 in FIG. 5, to change the pulse width of the next main pulse; as above, if the EUV output is too low, the pulse width is lengthened, while if the EUV output is too high then the pulse width is shortened. The pulse width may be changed, for example, by the use of an EOM such as that shown in FIG. 3; one of skill in the art will appreciate that other types of optical switches are also available to do so. The method returns to step 901 to generate the next main pulse. (The pre-pulses take place between the main pulses and are not illustrated here.)

If the result of the comparison at step 903 is that the EUV output is at the desired level, or within a desired range, then at step 905 the pulse width is compared to the acceptable range. If the pulse width is within the acceptable range, then the method returns to step 901 to generate another pulse. However, if the pulse width is out of the acceptable range, then a signal is sent to the RF generator to change the duty cycle of the laser amplifier, for example by the RF controller 508 in FIG. 5. As above, if the pulse width is too short, the duty cycle of the laser amplifier will be decreased, decreasing the EUV output so that the pulse width may be lengthened to again fall within the acceptable range, while if the pulse width is too long then the duty cycle will be increased, increasing the EUV output so that the pulse width may be shortened to fall within the acceptable range. Operation of the system and control of the laser amplifier duty cycle and the main pulse width continues in this fashion as pulses are repeatedly generated.

The disclosed method and apparatus has been explained above with reference to several embodiments. Other embodiments will be apparent to those skilled in the art in light of this disclosure. Certain aspects of the described method and apparatus may readily be implemented using configurations other than those described in the embodiments above, or in conjunction with elements other than those described above. For example, different modeling algorithms to determine the initial conditions of the seed laser operation or different types of seed lasers may be used. The RF controller and pulse width controller may be implemented in a variety of ways, as will be evident to one of skill in the art. One of skill in the art will appreciate that there are a variety of ways to implement the process described with respect to FIG. 9; for example, explicit "if-then" commands are not needed, but rather comparisons may be made between desired values and actual measured values, and a number resulting from that comparison passed to an appropriate controller, as shown in FIG. 5.

As noted, it is possible that the pre-pulses may not need to pass through an EOM or be amplified at all, or may be amplified by a different amplifier than that used to amplify the main pulses. However, the use of the EOM allows the pre-pulses to pass through the same amplifier as the main pulse if desired, without the complexity or expense of a second amplifier. Also as noted, other types of lasers than $CO_2$ of YAG lasers, and other configurations than MOPA or MOPA+PP, may be used.

It should also be appreciated that the described method and apparatus can be implemented in numerous ways, including as a process, an apparatus, or a system. The methods described herein may be implemented by program instructions for instructing a processor to perform such methods, and such instructions recorded on a computer readable storage medium such as a hard disk drive, floppy disk, optical disc such as a compact disc (CD) or digital versatile disc (DVD), flash memory, etc., or a computer network wherein the program instructions are sent over optical or electronic communication links. Such program instructions may be executed by means of a processor or controller, or may be incorporated into fixed logic elements. It should be noted that the order of the steps of the methods described herein may be altered and still be within the scope of the disclosure.

These and other variations upon the embodiments are intended to be covered by the present disclosure, which is limited only by the appended claims.

What is claimed is:

1. A method of controlling the output of an EUV LLP system having seed lasers which produce pre-pulses and main pulses, comprising:
    operating the seed lasers to generate a pre-pulse and a main pulse, each of the pre-pulse and the main pulse having a respective pulse width;
    amplifying the main pulse with an amplifier having a duty cycle controlled RE pump rate and irradiating a target material with the amplified pukes to generate an EUV output having energy;
    adjusting the pulse width of the main pulse by shortening the pulse width of the main pulse if the generated EUV output energy is above a desired EUV output energy and lengthening the pulse width of the main pulse if the EUV energy is below the desired EUV output energy;
    adjusting the duty cycle by increasing the duty cycle if the pulse width of the main pulse is longer than a desired range and decreasing the duty cycle if the pulse width of the main pulse is shorter than the desired range.

2. The method of claim 1 further comprising shortening the pulse width of the main pulse if the duty cycle is increased, and lengthening the pulse width of the main pulse if the duty cycle is decreased.

3. The method of claim 1 wherein adjusting the pulse width of the main pulse comprises passing the main pulse to an optical switch and adjusting the time the switch is open so as to allow only a desired width of each pulse to pass through the switch.

4. The method of claim 3 wherein the optical switch is an electro-optic modulator.

5. The method of claim 4 herein the electro-optic modulator comprises a cadmium-telluride crystal.

6. The method of claim 1 wherein one of the seed lasers is a $CO_2$ laser.

7. The method of claim 1 wherein one of the seed lasers is a YAG laser.

8. The method of claim 1 further comprising amplifying the pre-pulse.

9. The method of claim 8 wherein amplifying, the pre-pulse comprises passing the pre-pulse through the amplifier.

10. The method of claim 8 wherein amplifying the pre-pulse comprises passing the pre-pulse through a second amplifier.

11. A system for controlling the output energy of an EUV LLP system having seed lasers which produce a pre-pulse and a main pulse, each of the pre-pulse and the main pulse having a respective pulse width, comprising:
    optical switches capable of passing the pre-pulse and main pulse and opening and closing at a desired time to determine the width of each pulse that is passed through the switch;
    an amplifier having a duty cycle for amplifying the main pulse;
    a target chamber for irradiating a target material with the amplified pulses such that EUV output energy is produced;
    a sensor for measuring the EUV output energy and generating a sensor signal indicating the level of the EUV output energy compared to a desired EUV output energy;
    a pulse width controller for:
        receiving the sensor signal and generating a first pulse width signal instructing the optical switch to shorten the width of the next main pulse if the EUV output energy is above the desired energy and lengthen the width of the next main pulse if the EUV energy is below the desired output energy, and
        generating a second pulse width signal indicating the length of the pulse width of the main pulse compared to an acceptable range; and
    a duty cycle controller for receiving the second pulse width signal and increasing the duty cycle if the pulse width of the main pulse is longer than the acceptable range and decreasing the duty cycle if the pulse width of the main pulse is shorter than the acceptable range.

12. The system of claim 11 wherein the optical switch is an electro-optic modulator.

13. The system of claim 12 herein the electro-optic modulator comprises a cadmium-telluride crystal.

14. The system of claim 11 wherein one of the seed lasers is a $CO_2$ laser.

15. The system of claim 11 wherein one of the seed lasers is a YAG laser.

16. The system of claim 11 wherein the amplifier is also for amplifying the pre-pulse.

17. The system of claim 11 further comprising a second amplifier for amplifying the pre-pulse.

18. A non-transitory computer-readable medium having embodied thereon a program, the program being executable by a processor to perform a method of controlling the output of an EUV LLP system having a seed laser which produces pre-pulses and main pulses, the method comprising the steps of:

operating the seed lasers to generate a pre-pulse and a main pulse, each of the pre-pulse and the main pulse having a respective pulse width;

amplifying the main pulse with an amplifier having a duty cycle controlled RF pump rate and irradiating a target material with the amplified pulses to generate an EUV output having energy;

adjusting the pulse width of the main pulse by shortening the pulse width of the main pulse if the generated EUV output energy is above a desired EUV output energy and lengthening the pulse width of the main pulse if the EUV energy is below the desired EUV output energy;

adjusting the duty cycle by increasing the duty cycle if the pulse width of the main pulse is longer than a desired range and decreasing the duty cycle if the pulse width of the main pulse is shorter than the desired range.

* * * * *